(12) United States Patent
Quick et al.

(10) Patent No.: US 9,343,310 B1
(45) Date of Patent: May 17, 2016

(54) METHODS OF FORMING CONDUCTORS AND SEMICONDUCTORS ON A SUBSTRATE

(71) Applicants: Nathaniel R Quick, Lake Mary, FL (US); Michael C Murray, Eustis, FL (US)

(72) Inventors: Nathaniel R Quick, Lake Mary, FL (US); Michael C Murray, Eustis, FL (US)

(*) Notice: Subject to any disclaimer, the term of this patent is extended or adjusted under 35 U.S.C. 154(b) by 267 days.

(21) Appl. No.: 13/928,341

(22) Filed: Jun. 26, 2013

Related U.S. Application Data

(60) Provisional application No. 61/690,452, filed on Jun. 27, 2012, provisional application No. 61/786,987, filed on Mar. 15, 2013.

(51) Int. Cl.
| | |
|---|---|
| *H01L 21/20* | (2006.01) |
| *H01L 21/26* | (2006.01) |
| *H01L 21/283* | (2006.01) |
| *H01L 21/3205* | (2006.01) |
| *H01L 21/02* | (2006.01) |
| *H01B 13/00* | (2006.01) |
| *H01L 21/228* | (2006.01) |
| *H01L 33/02* | (2010.01) |

(52) U.S. Cl.
CPC .......... *H01L 21/2026* (2013.01); *H01B 13/003* (2013.01); *H01L 21/02266* (2013.01); *H01L 21/02675* (2013.01); *H01L 21/02697* (2013.01); *H01L 21/228* (2013.01); *H01L 21/283* (2013.01); *H01L 33/02* (2013.01)

(58) Field of Classification Search
CPC ................. H01L 21/28556; H01L 21/002266; H01L 21/48; H01L 21/71; H01L 21/02675; H01L 21/2026; H01L 51/0027; G02F 1/161; G02F 1/153; G02F 1/155; G02F 1/157; C23C 14/34

See application file for complete search history.

(56) References Cited

U.S. PATENT DOCUMENTS

| | | | | | |
|---|---|---|---|---|---|
| 5,038,950 | A | * | 8/1991 | Yahagi | G02F 1/1309 219/121.63 |
| 5,336,636 | A | * | 8/1994 | Burmer | H01L 21/3105 257/E21.241 |
| 5,567,336 | A | * | 10/1996 | Tatah | C23C 14/048 156/272.8 |
| 5,814,165 | A | * | 9/1998 | Tatah | B08B 7/0042 134/1 |
| 6,448,158 | B2 | * | 9/2002 | Peng | H01L 31/1884 438/482 |
| 2008/0202798 | A1 | * | 8/2008 | Satoh | H01J 9/02 174/255 |
| 2011/0272711 | A1 | * | 11/2011 | Okano | H01L 21/0485 257/77 |

* cited by examiner

*Primary Examiner* — Dale E Page
*Assistant Examiner* — Paul Budd
(74) *Attorney, Agent, or Firm* — Frijouf, Rust & Pyle, P.A

(57) ABSTRACT

An apparatus and a method are disclosed for forming electrical conductors and/or semiconductors on a glass substrate. The electrical conductors and/or semiconductors are formed by applying a conducting material or a semiconductor material to a surface of the glass substrate and irradiating the interface with a focused laser beam transmitted through the glass. An electrical conductor may be formed on a glass substrate or a semiconductor substrate to provide an electrical antenna for radio frequency communication.

16 Claims, 5 Drawing Sheets

METHODS OF FORMING CONDUCTORS AND SEMICONDUCTORS ON A SUBSTRATE

CROSS-REFERENCE TO RELATED APPLICATIONS

This application claims benefit of U.S. Patent Provisional application No. 61/690,452 filed Jun. 27, 2012 and claims benefit of U.S. Patent Provisional application No. 61/786,987 filed Mar. 15, 2013. All subject matter set forth in provisional application No. 61/690,452 filed Jun. 27, 2012 and 61/786,987 filed Mar. 15, 2013 is hereby incorporated by reference into the present application as if fully set forth herein.

BACKGROUND OF THE INVENTION

1. Field of the Invention

This invention relates to electrical conductors and semiconductors and more particularly to an apparatus and a method for forming an electrical conductor and/or a semiconductor device on a substrate. The electrical conductor and/or a semiconductor device may be formed on a glass substrate or a semiconductor substrate.

2. Description of the Related Art

The prior art is abundant in prior art for forming an electrical conductor on a substrate. Many electrical conductors are used to interconnect electrical components to form an operating circuit. Some in the prior art have electrical conductors mounted on surfaces to provide an antenna for radio frequency communication. Cellular phone, portable computers, tablets and the like incorporate antennas mounted on surfaces for radio frequency communication. The following is patent represent advancement in the antenna art.

U.S. Pat. No. 4,318,109 to Weathers discloses a broadband antenna system capable of receiving VHF, FM, and UHF bands, having highly desirable directional properties, providing sharp nulls for the rejection of unwanted reflections, and with broad directional properties, usually obtainable only with large tunable dipoles or loops, many times the dimensions of this very compact antenna unit. This is strictly a receiving antenna, since it has no radiation capabilities, and consequently minimal loss of received signal due to re-radiation.

U.S. Pat. No. 4,358,769 to Tada et al discloses a loop antenna apparatus is disclosed which includes a main conductive loop arranged on a first surface, a plurality of supplemental conductive loops connected to the main conductive loop and arranged on different surfaces from the first surface, respectively, a plurality of signal feeding points provided in different loops of the main and supplemental conductive loops, an output terminal and change-over switches for selectively connecting one of the plurality of signal feeding points to the output terminal.

U.S. Pat. No. 4,381,566 to Kane discloses at the feed side of each antenna element having transmitting conductor paths formed in continuous meandering shapes and having distributed constant impedances are electrically connected a variable tuning unit including a voltage variable reactance circuit and an impedance adjusting reactance element, thereby constituting an antenna circuit. A voltage variable capacitor is connected within the voltage variable reactance circuit. Antenna feed terminals are connected through a coaxial cable to input terminals of a remote-set radio receiver. A tuning control signal generated within the radio receiver is fed to a voltage variable capacitor within the voltage variable reactance circuit of the antenna circuit through the coaxial cable. The tuning control signal allows the antenna circuit to resonate with a particular frequency within a frequency band, the frequency being variable. The antenna element having the distributed constant inductance functions so as to have the best possible antenna radiation efficiency at resonant frequency signal by being in combination with the variable tuning unit and the antenna element is considerably reduced in size. At the resonant frequency signal, the characteristic impedance at the feed terminals of the antenna circuit becomes equal to that impedance at the receiving input terminals at the radio receiver connected to the antenna circuit, whereby an RF signal at the resonant frequency is selected and fed most efficiency to the radio receiver through the coaxial cable.

U.S. Pat. No. 5,164,738 to Walter, et al discloses an antenna includes at least one element whose physical shape is at least partially defined as a second or higher iteration deterministic fractal. The resultant fractal antenna does not rely upon an opening angle for performance, and may be fabricated as a dipole, a vertical, or a quad, among other configurations. The number of resonant frequencies for the fractal antenna increases with iteration number N and more such frequencies are present than in a prior art Euclidean antenna. Further, the resonant frequencies can include non-harmonically related frequencies. At the high frequencies associated with wireless and cellular telephone communications, a second or third iteration, preferably Minkowski fractal antenna is implemented on a printed circuit board that is small enough to fit within the telephone housing. A fractal antenna according to the present invention is substantially smaller than its Euclidean counterpart, yet exhibits at least similar gain, efficiency, SWR, and provides a 50 OMEGA termination impedance without requiring impedance matching.

U.S. Pat. No. 6,452,553 to Cohen discloses an antenna includes at least one element whose physical shape is at least partially defined as a second or higher iteration deterministic fractal. The resultant fractal antenna does not rely upon an opening angle for performance, and may be fabricated as a dipole, a vertical, or a quad, among other configurations. The number of resonant frequencies for the fractal antenna increases with iteration number N and more such frequencies are present than in a prior art Euclidean antenna. Further, the resonant frequencies can include non-harmonically related frequencies. At the high frequencies associated with wireless and cellular telephone communications, a second or third iteration, preferably Minkowski fractal antenna is implemented on a printed circuit board that is small enough to fit within the telephone housing. A fractal antenna according to the present invention is substantially smaller than its Euclidean counterpart, yet exhibits at least similar gain, efficiency, SWR, and provides a 50 OMEGA termination impedance without requiring impedance matching.

U.S. Pat. No. 6,538,606 to Quinn et al discloses a computer system that provides for an antenna port with a bay or door that receives a module containing an antenna. The antenna module contains an antenna or a set of antennas that support wireless communication technologies contained in the computer system. The antenna module is "standardized" and can be used for various computer systems employing the standard port with the bay or door. The antenna module may be developed and certified separate from the notebook system. In addition to the antennas, a diversity switch may be added the diversity switch is used to choose the proper antenna for communication. A high gain amplifier and filters to compensate for RF signals may also be added to the module. A receiver, transmitter, or transceiver device may be added to the module or may be placed in the computer system. Placing the device on the module allows the transmission of digital signals, providing decreased signal loss along transmission lines. Power is provided to the module by a separate power line from the computer system.

U.S. Pat. No. 6,677,906 to Quinn discloses a portable computer includes a base and a top movably mounted on the base. A non-conductive transparent display layer is mounted in the top and includes a channel formed therein that contains layers of transparent conductive and transparent non-conductive materials. A cable is connected to the base. A cable extension is coupled to and extends from the cable. The cable extension is imbedded in the channel. An antenna is coupled to the cable extension and is imbedded in the channel.

U.S. Pat. No. 7,608,308 to Liu, et al. discloses a p-type semiconductor zinc oxide (ZnO) film and a process for preparing the film are disclosed. The film is co-doped with phosphorous (P) and lithium (Li). A pulsed laser deposition scheme is described for use in growing the film. Further described is a process of pulsed laser deposition using transparent substrates which includes a pulsed laser source, a substrate that is transparent at the wavelength of the pulsed laser, and a multi-target system. The optical path of the pulsed laser is arranged in such a way that the pulsed laser is incident from the back of the substrate, passes through the substrate, and then focuses on the target. By translating the substrate towards the target, this geometric arrangement enables deposition of small features utilizing the root of the ablation plume, which can exist in a one-dimensional transition stage along the target surface normal, before the angular width of the plume is broadened by three-dimensional adiabatic expansion. This can provide small deposition feature sizes, which can be similar in size to the laser focal spot, and provides a novel method for direct deposition of patterned materials.

U.S. Pat. No. 7,666,511 to Ellison, et al. discloses an alkali aluminosilicate glass that is chemically strengthened and has a down-drawable composition. The glass has a melting temperature less than about 1650 degree C. and a liquidus viscosity of at least 130 kpoise and, in one embodiment, greater than 250 kpoise. The glass undergoes ion exchange at relatively low temperatures to a depth of at least 30.mu.m.

The present invention is an improvement to prior inventions related to forming electrical conductors and processing wide bandgap materials using thermal energy beams or laser beams. Discussion of wide bandgap materials and the processing thereof are discussed in the following U.S. Patents issued to the instant inventor Nathaniel R. Quick PhD. The following U.S. Patents are hereby incorporated by reference into the present application as if fully set forth herein: U.S. Pat. No. 5,145,741; U.S. Pat. No. 5,391,841; U.S. Pat. No. 5,793,042; U.S. Pat. No. 6,732,562; U.S. Pat. No. 5,837,607; U.S. Pat. No. 6,271,576; U.S. Pat. No. 6,025,609; U.S. Pat. No. 6,054,375; U.S. Pat. No. 6,670,693; U.S. Pat. No. 6,939,748; U.S. Pat. No. 6,930,009; U.S. Pat. No. 7,013,695; U.S. Pat. No. 7,237,422; U.S. Pat. No. 7,268,063; U.S. Pat. No. 7,419,887; U.S. Pat. No. 7,951,632; U.S. Pat. No. 7,811,914 and U.S. Pat. No. 7,897,492.

Therefore, it is an objective of this invention is to provide an apparatus and a method for forming electrical conductors on a substrate.

Another objective of this invention is to provide an apparatus and a method for forming electrical conductors on a semiconductor substrate.

Another objective of this invention is to provide an apparatus and a method for forming a semiconductor device on a substrate to produce various semiconductor devices.

Another objective of this invention is to provide an apparatus and a method for forming and electrical conductors and/or a semiconductor device on a substrate through laser processing.

Another objective of this invention is to provide an apparatus and a method for forming and electrical conductors and/or a semiconductor device on a substrate through a plasma arc lamp processing.

Another objective of this invention is to provide an apparatus and a method for forming a conductive electrical antenna on a glass substrate or a semiconductor substrate.

The foregoing has outlined some of the more pertinent objects of the present invention. These objects should be construed as being merely illustrative of some of the more prominent features and applications of the invention. Many other beneficial results can be obtained by modifying the invention within the scope of the invention. Accordingly other objects in a full understanding of the invention may be had by referring to the summary of the invention, the detailed description describing the preferred embodiment in addition to the scope of the invention defined by the claims taken in conjunction with the accompanying drawings.

SUMMARY OF THE INVENTION

The present invention is defined by the appended claims with specific embodiments being shown in the attached drawings. For the purpose of summarizing the invention, the invention relates to an improved method for forming an electrical conductor on a glass substrate. The method comprises the steps of applying a conducting material onto a surface of the glass substrate. A laser beam is focused through the glass substrate onto an interface of the conducting material and the surface of the glass substrate to form an electrical conductor bonded to the glass substrate.

In a more specific example of the invention, the step of applying a conducting material onto a surface of the glass substrate includes applying a powder or solid precursor onto a surface of the glass substrate. In the alternative, the step of applying a conducting material onto a surface of the glass substrate includes applying a metal organic gas or metal vapor precursor onto a surface of the glass substrate.

Preferably, the step of forming an electrical conductor bonded to the glass substrate includes forming a transparent electrical conductor bonded to the glass substrate. In one embodiment, the method includes the step of applying an electric field across the interface of the conducting material and the surface of the glass substrate to enhance the forming of the electrical conductor bonded to the glass substrate. The method is suitable for forming a conductive antenna bonded to the glass substrate.

The invention is incorporated into a method for forming an electrical conductor on a semiconductor substrate comprising the steps of applying a conducting material onto a surface of the semiconductor substrate. A laser beam is focused onto an interface of the conducting material and the surface of the semiconductor substrate to form an electrical conductor bonded to the semiconductor substrate. The method is suitable for forming a conductive antenna bonded to the semiconductor substrate.

The invention is incorporated into a method for forming a semiconductor device on a glass substrate comprising the steps of forming a first electrical conductor on a surface of the glass substrate. A semiconductor material is applied onto the first electrical conductor. A laser beam is focused onto an interface of the semiconductor material and the first electrical conductor to form a semiconductor bond to the first electrical conductor. A doping material is applied onto the semiconductor. A laser beam is focused onto an interface of the semiconductor and the doping material to convert a portion of the semiconductor into a doped semiconductor. A second electrical conductor is bonded to the doped semiconductor.

In a more specific example of the invention, the step of forming a first electrical conductor on a surface of the glass substrate includes applying a first conducting material onto a surface of the glass substrate and a laser beam is focused onto an interface of the conducting material and the surface of the glass substrate to form a first electrical conductor bonded to the glass substrate.

The invention is incorporated into a conductor or a semiconductor device formed on a glass substrate. The semiconductor device comprises a first electrical conductor bonded to the glass substrate. A semiconductor material is bonded to the first electrical conductor. A doped semiconductor material is formed in a portion of the semiconductor material. A second electrical conductor is bonded to the doped semiconductor material.

In one example, the semiconductor device includes a light emitting device formed on the glass substrate. The light emitting device comprises a thermally fused layer formed from a mixture of powdered silicon carbide and powdered tungsten. A first and a second electrical connector are connected to the thermally fused layer.

The foregoing has outlined rather broadly the more pertinent and important features of the present invention in order that the detailed description that follows may be better understood so that the present contribution to the art can be more fully appreciated. Additional features of the invention will be described hereinafter which form the subject of the claims of the invention. It should be appreciated by those skilled in the art that the conception and the specific embodiments disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a fuller understanding of the nature and objects of the invention, reference should be made to the following detailed description taken in connection with the accompanying drawings in which.

Similar reference characters refer to similar parts throughout the several Figures of the drawings.

DETAILED DISCUSSION

Figure 1:
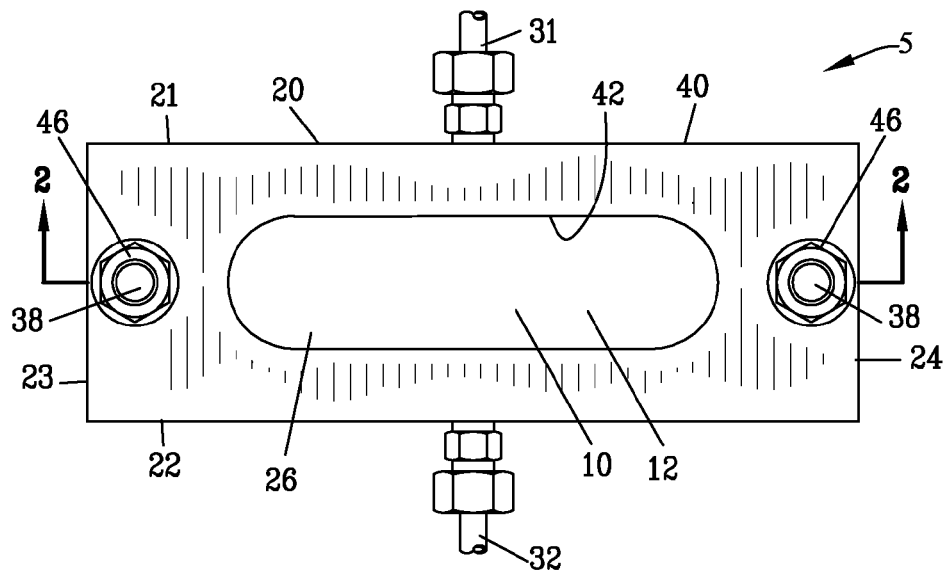
FIG. 1 is a top view of a first apparatus for forming electrical conductors and/or semiconductors on a substrate in accordance with the present invention.
Figure 2:
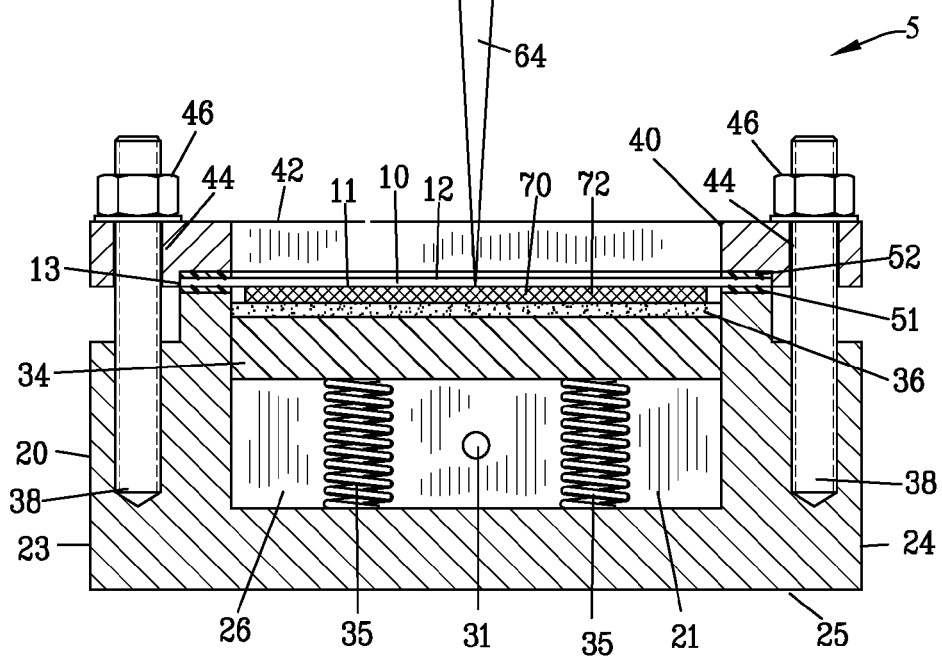
FIG. 2 is a side sectional view along line 2-2 in FIG. 1.

FIGS. 1 and 2 are top and side views of an apparatus 5 for forming an electrical conductors and/or semiconductors on a substrate 10 in accordance with the present invention. The substrate 10 defines a first and a second side 11 and 12 and a peripheral edge 13. Although the substrate 10 is shown as a rectangle, the present invention is not limited by the physical configuration of the substrate 10 as shown herein. The substrate 10 may be an insulating substrate such as a glass substrate (SiO) or a semiconductor substrate such as silicon carbide (SiC).

The substrate 10 is shown located in a chamber 20. The air-tight chamber 20 comprises a plurality of wall 21-24 interconnected by a bottom wall 25 defining an interior space 26. An inlet port 31 and an outlet port 32 are located in the side wall 21 and 22 of the chamber 20 for injecting and removing gases into and out of the chamber 20, respectively.

A support 34 is moveably mounted within the interior space 26 of the chamber 20. The support 34 is biased in a direction away from the bottom wall 25. In this example, plural springs 35 urge the support 34 in a direction away from the bottom wall 25. It should be appreciated by those skilled in the art that various means may be used to bias the support 34 in a direction away from the bottom wall 25 including a resilient bias, a pneumatic bias, a magnetic bias and the like.

A heat absorbing material 36 is disposed upon the support 34. Plural studs 38 extend from opposed ends of the chamber 20. In this example, the chamber 20 and the support 34 are formed of an aluminum material but it should be understood that various material may be used for the chamber 20 and the support 34. Preferably, the heat absorbing material 36 is a graphite material.

A closure 40 is adapted to mate with the chamber 20 to form an airtight seal. The closure 40 includes a light transmitting window 42. The closure 40 includes plural apertures 44 for receiving the plural studs 38 extending from the chamber 20. Fastening nuts 46 secure the closure 42 the chamber 20.

A first seal 51 is disposed between the walls 21-24 and the first side 11 of the substrate 10. A second seal 52 is disposed between the closure 40 and the second side 12 of the substrate 10. The first and second seals 51 and 52 seal the substrate 10 within the chamber 20 and closure 44. Preferably, the first and second seals 51 and 52 are formed of a resilient material such as fluoropolymer elastomer or the like. The first and second seals 51 and 52 enable the substrate 10 to be processing in a selected atmosphere.

A laser 60 is directed into a scanner 62 for creating a focused laser beam 64 to pass through the substrate 10 and to impinge upon the first side 11 of the substrate 10. The scanner 62 enables the focused laser beam 64 to be positioned at various locations on the first side of the substrate 10. Preferably, the laser 60 and the scanner 62 are controlled by a computer 66.

FIG. 2 illustrates the method for forming an electrical conductor 70 on the substrate 10. A conducting material 72 is applied to the first side 11 of the glass substrate 10. In this example, a nickel powder 72 is bonded to a glass substrate 10. The nickel powder 72 is deposited onto the heat absorbing material 36 of the support 34. Plural springs 35 urge the nickel powder 72 into contact with the first side 1 of the substrate 10.

The laser beam 64 is focused onto an interface of the conducting material 72 and the first side 11 of the glass substrate 10 to form the electrical conductor 70. The concentrated laser beam 64 forms the electrical conductor 70 from the conducting material 72 and bonds the electrical conductor 70 to the glass substrate 10. The laser beam 64 is focused onto the interface of the conducting material 72 and the first side 11 of the glass substrate 10 processes selected areas of the glass substrate 10 within the chamber 20.

The plural springs 35 urging the nickel powder 72 into contact with the first side 11 of the glass substrate. Furthermore, the plural springs 35 urging the nickel powder 72 into contact with the first side 11 of the glass substrate 10 during the irradiation by the laser beam 64 to insure continuous contact of the nickel powder 72 with the glass substrate 10 assist in the sintering and fusion of the nickel powder 72 with the glass substrate 10.

Figure 3:
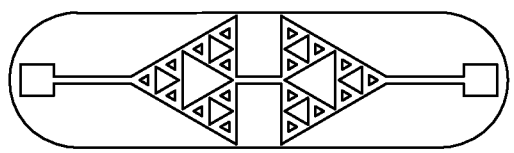
FIG. 3 is a top view of an electrical conductor bonded to a substrate.

FIG. 3 is a top view of the electrical conductor 70 bonded to the glass substrate 10. In the example, the electrical conductor 70 is formed in the shape of a fractal antenna. It should be understood that the electrical conductor 70 may be formed in any shape for various intended uses.

The apparatus 5 may be used to form an electrical conductor on a semiconductors substrate 10. An aluminum conductor antenna circuit can be deposited on an n-type SiC wide bandgap semiconductor from an argon+trimethyl aluminum solution (10 psi) metal-organic aluminum precursor that is flowed into the inlet port 31. A 1064 nm wavelength Nd:YAG laser, 18 W or greater, 10 kHz frequency, 8 microsecond on-off focused through the glass substrate irradiates the metal-organic aluminum precursor glass interface depositing aluminum on the glass substrate.

Figure 4:
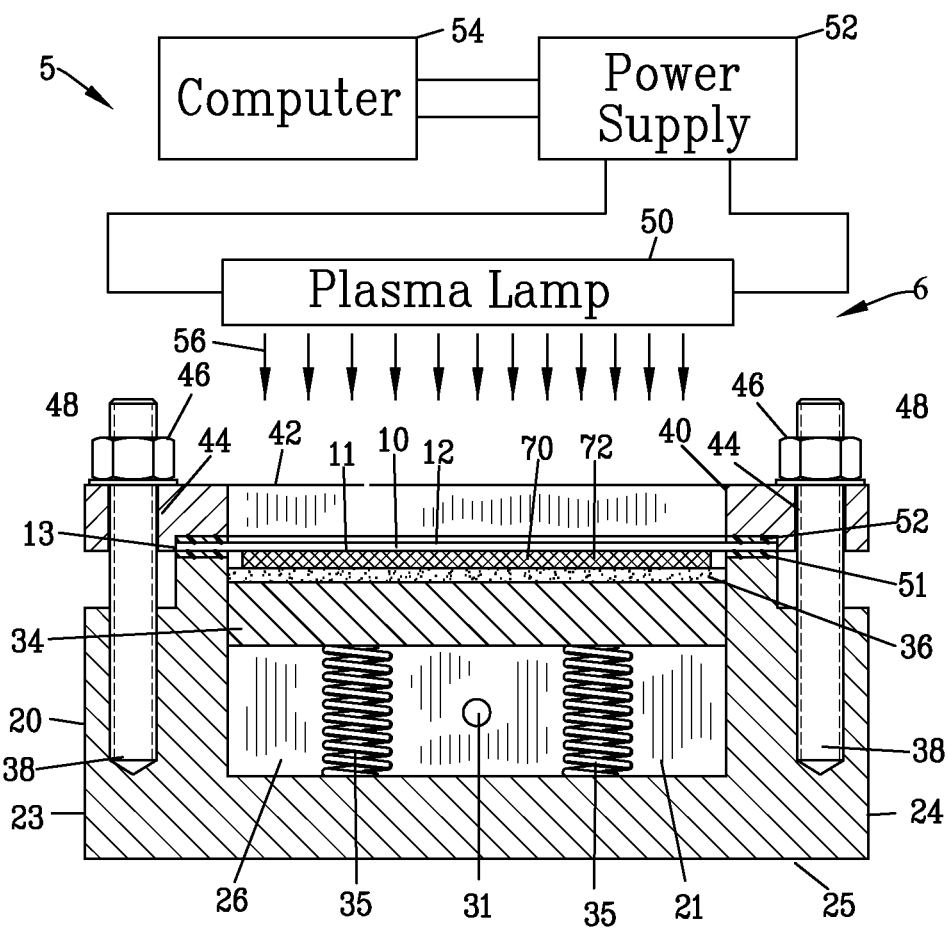
FIG. 4 is a side view of a second apparatus for forming electrical conductors and/or semiconductors on a substrate in accordance with the present invention.

FIG. 4 is a side view of a second apparatus 6 for forming electrical conductors and/or semiconductors on a substrate 10. The chamber 20 is identical to the chamber shown in FIGS. 1 and 2. The apparatus 6 comprises a high density plasma arc lamp 70 for irradiating the substrate 10 within the chamber 20. The plasma lamp 70 is powered by a power supply 72 to provide a plasma beam 74. The plasma lamp 70 is controlled by a computer 76. The computer 76 controls the intensity, pulse duration and the pulse frequency of the plasma lamp 70. The electromagnetic radiation emanating from the plasma lamp 70 is transmitted through the light transmitting top window 42 of the closure 40 to irradiate the substrate 10 in accordance with a computer program stored in the computer.

A suitable plasma lamp 70 is described in U.S. Pat. No. 4,937,490 and U.S. Pat. No. 7,220,936 that are incorporated by reference into the present specification as if fully set forth herein. The plasma lamp 70 can supply large power densities, (up to 20,000 Watts/centimeter$^2$) over large areas (4 meter$^2$) in short time frames (0.5 microseconds to 10.0 seconds).

The plasma lamp 70 is capable of quickly delivering large amounts of heat over large surface areas with little or no deleterious influence upon subsurface compositions. The computer 76 controls the pulse energy from the plasma lamp 70 in both duration and/or periodicity to allow precise control various process parameters. In the process of the present invention, the plasma lamp 70 is used for processing large areas or the entirety of the substrate 10.

The electromagnetic radiation emanating from the plasma lamp 70 is transmitted through the light transmitting top window 42 of the chamber 20 to irradiate the substrate 10 in accordance with a computer program stored in the computer. The interior space 26 of the chamber 20 may be a vacuum, a liquid substance, a fluid substance or a gas or vapor substance. In some application, a powdered substance may be introduced into the interior space 26 of the chamber 20.

Figure 5:
FIG. 5 is an enlarged side view of the glass substrate of FIG. 2 with a first conductor bonded to the glass substrate.

FIG. 5 is an enlarged side view of a second example of a substrate 10 with a semiconductor 90 bonded thereto. In this example, the substrate 10 is a glass substrate 10 and the semiconductor material is silicon carbide (SiC).

A first conductor 80 bonded to the glass substrate 10. The first conductor 80 may be formed in a specific pattern by the apparatus 5 shown in FIGS. 1-2 or may be formed across the entire surface of the exposed glass substrate 10 by the apparatus 6 shown in FIG. 4.

The apparatus 5 creates a specific pattern of the first conductor 80 is controlled by the characteristics of the laser beam 64 as well as the pattern of the scan of the laser beam 64 across the glass substrate 10. The apparatus 6 creates the first conductor 80 across the entire surface of the exposed glass substrate 10 by the plasma beam 74.

Figure 6:
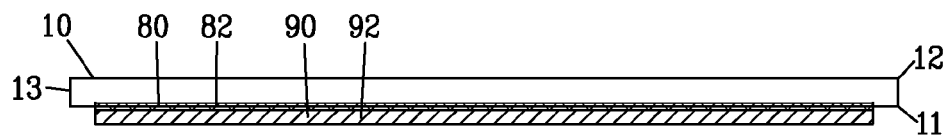
FIG. 6 is a side sectional view similar to FIG. 5 with a semiconductor bonded to the first electrical conductor.

FIG. 6 is a side sectional view similar to FIG. 5 with a semiconductor 90 bonded to the first electrical conductor 80. The semiconductor 90 is formed by applying a semiconductors material 92 onto the first electrical conductor 80 on the glass substrate 10 within the chamber 20. The laser beam 64 or the plasma bean impinges onto an interface of the semiconductors material 92 and the first electrical conductor 80 disposed on the first side 11 of the substrate 10. The laser beam 64 or the plasma beam 74 forms the semiconductor 90 from the semiconductor material 92 and bonds the semiconductor 90 to the electrical conductor 80 bonded to the substrate 10.

Figure 7:
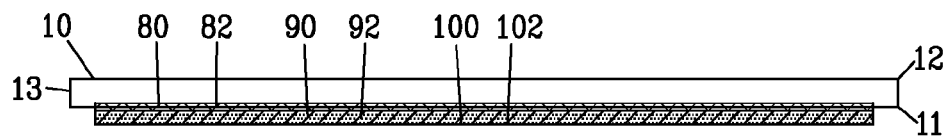
FIG. 7 is a side sectional view similar to FIG. 6 with a doped semiconductor formed in a portion of the semiconductor material.

FIG. 7 is a side sectional view similar to FIG. 4 with a doped semiconductor 100 formed in a portion of the semiconductor 90. The doped semiconductor 100 is formed by applying a doping material 102 is applied onto the semiconductor 100. A laser beam is focused for a onto an interface of the semiconductor 90 and the doping material 102 to convert a portion of the semiconductor 90 into a doped semiconductor 100. The process of forming the doped semiconductor 100 is undertaken within the chamber 20 shown in FIGS. 1 and 2.

Figure 8:
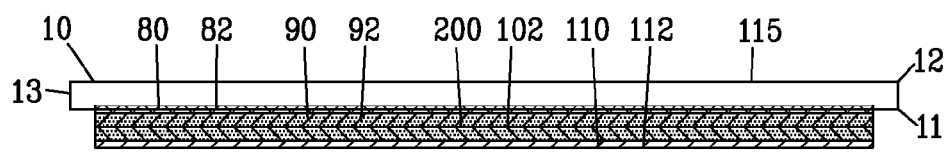
FIG. 8 is a side sectional view similar to FIG. 7 with a second electrical conductor is bonded to the doped semiconductor material.

FIG. 8 is a side sectional view similar to FIG. 5 with a second electrical conductor 110 bonded to the doped semiconductor 100. The second electrical conductor 110 is formed by applying a second conducting material 112 onto the doped semiconductor 100. A laser beam 64 is focused onto an interface of the second conducting material 112 and the doped semiconductor 100 to form the second electrical conductor 110 bonded to the doped semiconductor 100. In the alternative, the second electrical conductor 110 may be bonded to the doped semiconductor 100 in a conventional manner as should be well known to those skilled in the art.

FIG. 8 illustrates a semiconductor device 130 formed on a glass substrate 10 comprising the first electrical conductor 80 bonded to the glass substrate 10. A semiconductor 90 is bonded to the first electrical conductor 80. A doped semiconductor 100 is formed in a portion of the semiconductor 90. A second electrical conductor 110 is bonded to the doped semiconductor 100.

Figure 9:
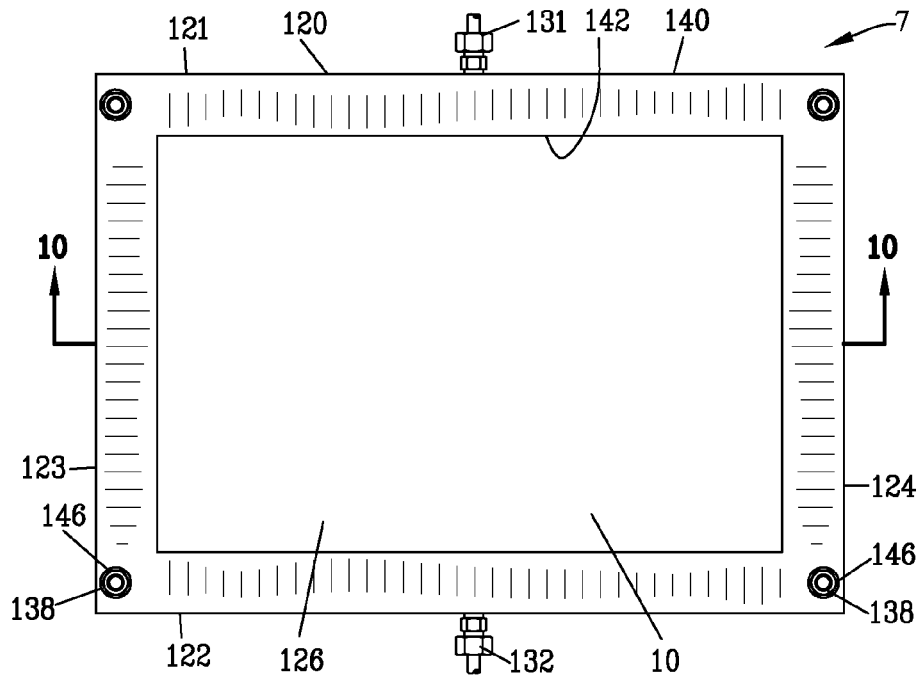
FIG. 9 is a top view of a third apparatus for forming electrical conductors and/or semiconductors on a substrate with the assistance of an electric field.
Figure 10:
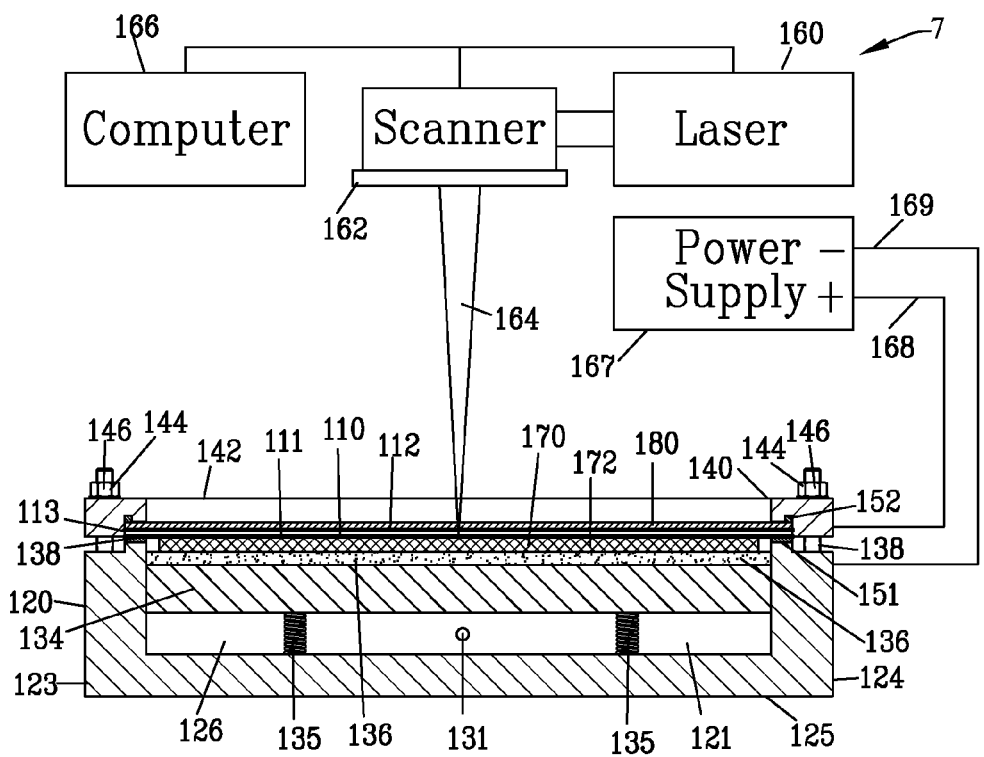
FIG. 10 is a side sectional view along line 10-10 in FIG. 9.
Figure 11:
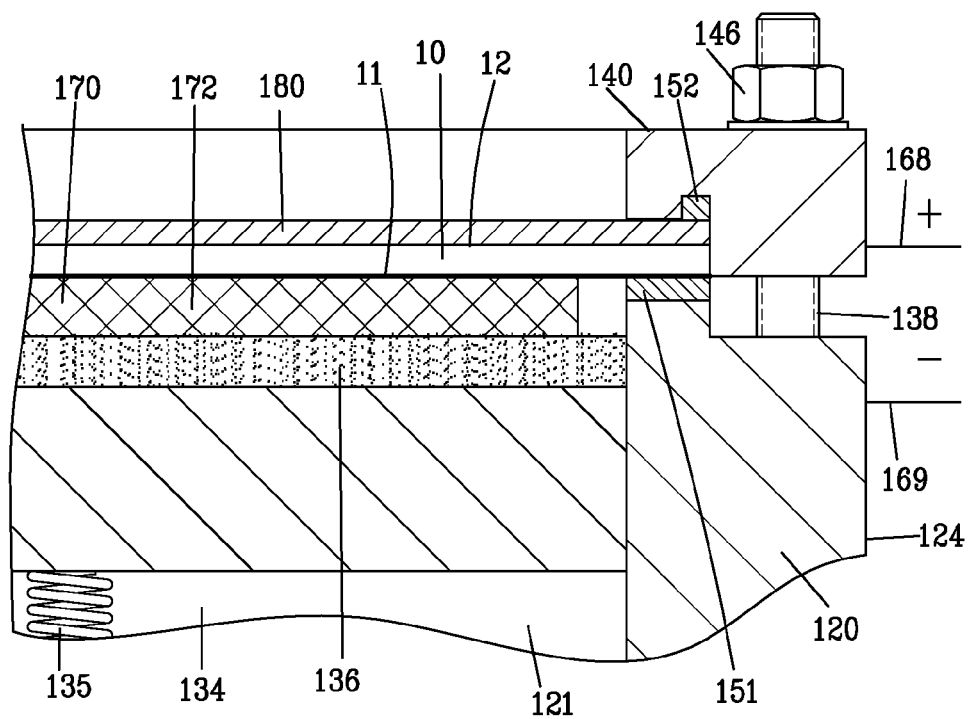
FIG. 11 is an enlarged view of a portion of FIG. 10.

FIGS. 9-11 are views of a third apparatus 7 for forming electrical conductors and/or semiconductors on a substrate 10 with the assistance of an electric field. The third apparatus 7 is substantially identical to the apparatus 5 shown in FIG. 1 and with similar part labeled with similar numerals increased by 100.

The third apparatus 7 includes a power supply 167 for providing a Direct Current voltage on conductors 168 and 169. The conductors 168 and 169 are connected to the conductive chamber 120 and the conductive closure 140, respectively. The conductive chamber 120 is in electrical contact with a conductive heat absorbing material 136 whereas the conductive closure 140 is in electrical contact with a transparent electrode 180. Upon application of electrical power from the power supply 167, an electric filed is established between the conductive heat absorbing material 136 and the transparent electrode 180. The electric field extends across the interface of the interface of the conducting material 172 and the first side 11 of the glass substrate 10. It should be appreciated by those skilled in the art that the transparent electrode 180 may be a separate component as shown or may be incorporated into the light transmitting window 143.

An electric field is applied vertically across the substrate 10 and powder precursor to assist in fusion with the substrate 10 and diffusion into the conductive material powder 172 and substrate 10. The laser beam 164 produces a heat source during the process of anodic bonding. A modified version of this would be to coat a substrate 10 with a metal and then subject this to the process in order to diffuse the metal into the substrate 10. This results in conductive paths within the substrate 10 allowing for connection of embedded components The process comprises sandwiching the glass substrate 10 between two planar electrodes 136 and 180 allowing for irradiation of the substrate 10 with the laser beam 64. To achieve total planar electrode contact with the surface that transmits the laser beam 164, indium tin oxide or doped zinc oxide which are transparent, either as solid substrates or deposited as a film on glass, can be used for the top planar electrode 180. A voltage 400-100V D.C. is then applied with the positive being one plate and the negative the other. The substrate 10 is then irradiated with the laser bean 164 in order to provide heat which will facilitate diffusion of the metal precursor, solid, coating or powder. Polarity of the power supply 172 is determined by the material used in the process.

The process can also be used to bond glass to semiconductors, such as silicon and silicon carbide wafers as it is conventionally performed with a large heat source. In this case the large heat source used in conventional semiconductor to glass bonding will be replaced with the laser which will allow for selective heating and increased localized energy to provide improve bonding by thermal diffusion of the materials.

Figure 12:
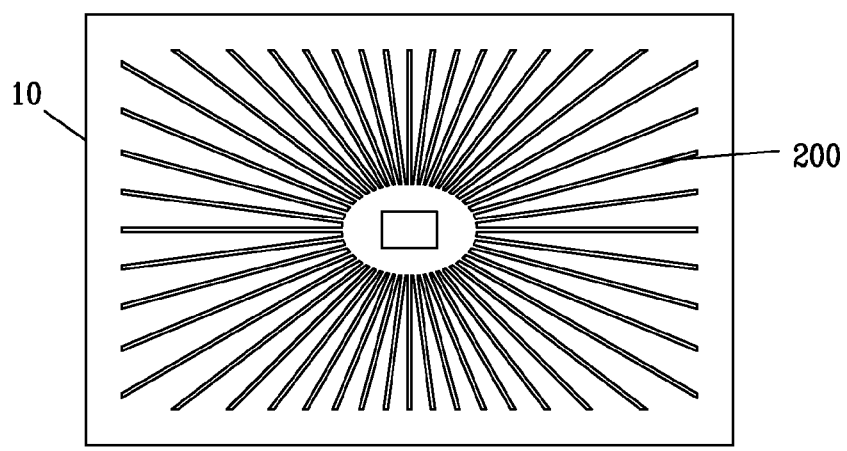
FIG. 12 is a top view an electrical conductor bonded to a substrate.

FIG. 12 is a top view an electrical conductor 200 bonded to a glass substrate 10. In this example, the electrical conductor 200 is shown as antenna suitable for use in a cellular phone, laptop computer, tablet, television or the like. In some instances, the electrical conductor 200 on the glass substrate is virtually invisible, making the antenna suitable for installation on the screen of the cellular phone, laptop computer, tablet or television.

Example I

Silicon oxide base glass is used as the substrate. The precursor of the material to be synthesized on the glass is placed in intimate contact with the glass substrate by methods including:
1. laser deposition from a metal organic simultaneous with bonding;
2. Pressure compaction of a precursor powder against the glass substrate;
3. Deposition of a thin film by CVD and sputtering techniques;
4. Polymer thick film deposition of a composition of precursor particles and a binder.

The glass precursor interface is positioned at the bottom in a fixture and behaves as a top seal. The chamber is evacuated and backfilled with forming gas (4% hydrogen+96% argon) to remove residual oxides on the precursor during laser processing. A frequency doubled Nd:YAG laser emitting 532 nm wavelength, scan speed of 10-20 in/second, 6000 KHz (pulses per second), 8 microsecond on-off cycling was used. The laser beam is transmitted through the top of the glass to the bottom glass precursor interface. The beam diameter is 20 micron or larger and can be Gaussian, top hat or pitchfork or other custom profiles. These parameters prevent glass cracking or damage and ensured metal and/or semiconductor path continuity.

An appropriate first conductor is nickel which bonds to glass either as a metal or as a nickel (II) oxide (NiO) layer and accommodates thermal expansion matching. A preferred particle size is 1 micron or less which effectively reduces the required energy for bonding/adhesion given the increasing surface energy with decreasing particle diameter. Tungsten bonds to glass via an intermediate layer of tungsten (VI) oxide (WO). Laser bonding of nickel is preferred for fabrication of a silicon carbide semiconductor device on glass since it bonds to silicon carbide and serves as a metal contact for the n-type semiconductor material.

Example II

For antenna applications a metal having a high conductivity and low permeability, such as aluminum, silver and copper are typically used. Aluminum shows similar bonding to glass as does nickel by forming an intermediate aluminum oxide layer and is preferred in our process. For example, processing at 18 W or greater, 10 psi, 4% Hydrogen+96% Argon (forming gas), 532 nm Nd:YAG bonds aluminum to the glass substrate.

Next silicon carbide is deposited on the nickel.

Next the silicon carbide (Washington Mills green 1200) is laser doped with nitrogen.

Next aluminum is laser deposited on the silicon carbide for p-type doping and p-type contact.

For the above steps 532 nm wavelength in the scan rate range of 25.4 cm/sec and 50.8 cm/sec is preferred. 1064 nm (near infrared) is also applicable to supplying thermal energy for bonding subsequent compositions to the initial nickel conductor. Line width of the conductors and semiconductors increases with decreasing scan speed. An aperture can be used to also decrease beam diameter. Nano lines can be formed by apparatus disclosed by the instant inventor Nathaniel R. Quick PhD. in U.S. Pat. No. 8,393,289.

Example III

A mixture of powdered silicon carbide (a wide bandgap semiconductor) and powdered tungsten (filament metal) was placed on a graphite block in the spring loaded chamber 40. The chamber 40 was then evacuated and filled with forming gas (4% $H_2$ Bal. Argon). Laser radiation (532 nm Nd:YAG 80 watts, 0.070 inch aperture, 10 kHz pulse repetition, scan speed 2 mm/ms) was then applied and the mixture deposited on the glass in the pattern of the beam generated by a scanner. The glass with the deposited powder mix was then placed in a vacuum chamber which was evacuated and power applied to the ends of the deposited pattern. The pattern was in the form of a line. When direct current (DC) power was applied, the line pattern began to glow with intensity increasing with amperage and corresponding voltage.

Example IV

Another sample was made with the addition of contacts to either end of the deposited line. This was accomplished by employing the same process with the use of nickel powder, instead of the silicon carbide tungsten mixture to form the contacts.

Percentage mixtures of wide bandgap semiconductor powders, metal powders, dopant powders and dopant gases can be varied. Different percentage mixtures of wide bandgap semiconductor powders, metal powders, dopant powders and dopant gases will be explored in future experiments.

The present disclosure includes that contained in the appended claims as well as that of the foregoing description. Although this invention has been described in its preferred form with a certain degree of particularity, it is understood that the present disclosure of the preferred form has been made only by way of example and that numerous changes in the details of construction and the combination and arrangement of parts may be resorted to without departing from the spirit and scope of the invention.

What is claimed is:

1. A method for forming a conductive antenna on a glass substrate; comprising the steps of:
   applying a conducting material onto a surface of the glass substrate; and
   focusing a laser beam through the glass substrate onto an interface of the conducting material and the surface of the glass substrate to form a conductive antenna bonded to the glass substrate.

2. A method for forming a conductive antenna on a glass substrate as set forth in claim 1, wherein the step of applying a conducting material onto a surface of the glass substrate includes applying a powder or solid precursor onto a surface of the glass substrate.

3. A method for forming a conductive antenna on a glass substrate as set forth in claim 1, wherein the step of applying a conducting material onto a surface of the glass substrate includes applying a metal organic gas or metal vapor precursor onto a surface of the glass substrate.

4. A method for forming a conductive antenna on a glass substrate as set forth in claim 1, wherein the step of forming an electrical conductor bonded to the glass substrate includes forming a transparent electrical conductor bonded to the glass substrate.

5. A method for forming a conductive antenna on a glass substrate as set forth in claim 1, including the step of applying an electric field across the interface of the conducting material and the surface of the glass substrate to enhance the forming of the electrical conductor bonded to the glass substrate.

6. A method for forming an electrical conductor on a semiconductor substrate; comprising the steps of:
   applying a conducting material onto a surface of the semiconductor substrate;
   applying an electric field across the interface of the conducting material and the surface of the semiconductor substrate to enhance the forming of the electrical conductor bonded to the semiconductor substrate; and
   focusing a laser beam onto an interface of the conducting material and the surface of the semiconductor substrate to form an electrical conductor bonded to the semiconductor substrate.

7. A method for forming an electrical conductor on a semiconductor substrate as set forth in claim 6, wherein the step of applying a conducting material onto a surface of the semiconductor substrate includes applying a powder or solid precursor onto a surface of the semiconductor substrate.

8. A method for forming an electrical conductor on a semiconductor substrate as set forth in claim 6, wherein the step of applying a conducting material onto a surface of the semiconductor substrate includes applying a metal organic gas or metal vapor precursor onto a surface of the semiconductor substrate.

9. A method for forming an electrical conductor on a semiconductor substrate as set forth in claim 6, wherein the step of applying a conducting material onto a surface of the semiconductor substrate includes forming a transparent electrical conductor bonded to the semiconductor substrate.

10. A method for forming an electrical conductor on a semiconductor substrate as set forth in claim 6, wherein the step of forming an electrical conductor bonded to the semiconductor substrate includes forming a conductive antenna bonded to the semiconductor substrate.

11. A method for forming a semiconductor device on a glass substrate; comprising the steps of:
    forming a first electrical conductor on a surface of the glass substrate;
    applying a semiconductor material onto the first electrical conductor;
    focusing a laser beam onto an interface of the semiconductor material and the first electrical conductor to form a semiconductor bond to the first electrical conductor;
    applying a doping material onto the semiconductor;
    focusing a laser beam onto an interface of the semiconductor and the doping material to convert a portion of the semiconductor into a doped semiconductor, and
    forming a second electrical conductor bonded to the doped semiconductor.

12. A method for forming a semiconductor on a glass substrate as set forth in claim 11, wherein the step of forming a first electrical conductor on a surface of the glass substrate includes applying a first conducting material onto a surface of the glass substrate; and
    focusing a laser beam onto an interface of the conducting material and the surface of the glass substrate to form a first electrical conductor bonded to the glass substrate.

13. A method for forming a semiconductor on a glass substrate as set forth in claim 11, wherein the step of applying a semiconductor material onto a surface of the glass substrate includes applying a powder or solid precursor onto a surface of the glass substrate.

14. A method for forming a semiconductor on a glass substrate as set forth in claim 11, wherein the step of applying a semiconductor material onto a surface of the glass substrate includes applying a metal organic gas or metal vapor precursor onto a surface of the glass substrate.

15. A method for forming a semiconductor on a glass substrate as set forth in claim 11, including the step of applying an electric field across the interface of the semiconductor material and the surface of the glass substrate to enhance the forming of the semiconductor device conductor bonded to the glass substrate.

16. A method for forming a semiconductor on a glass substrate as set forth in claim 11, wherein the step of forming a semiconductor device includes applying a mixture of powdered silicon carbide and powdered tungsten to the glass substrate to form a light emitting device upon the application of electrical power.

* * * * *